US012768893B2

(12) United States Patent
Lim et al.

(10) Patent No.: US 12,768,893 B2
(45) Date of Patent: Oct. 20, 2026

(54) METHOD AND APPARATUS FOR ADJUSTING VALUE OF CURRENT OF BATTERY

(71) Applicant: SAMSUNG ELECTRONICS CO., LTD., Suwon-si (KR)

(72) Inventors: Ju Wan Lim, Suwon-si (KR); Jinho Kim, Suwon-si (KR); Tae Won Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 729 days.

(21) Appl. No.: 18/297,754

(22) Filed: Apr. 10, 2023

(65) Prior Publication Data

US 2024/0133959 A1 Apr. 25, 2024
US 2024/0230768 A9 Jul. 11, 2024

(30) Foreign Application Priority Data

Oct. 24, 2022 (KR) ........................ 10-2022-0137606

(51) Int. Cl.
*G01R 31/374* (2019.01)
*G01R 31/367* (2019.01)
*G01R 31/388* (2019.01)

(52) U.S. Cl.
CPC ......... *G01R 31/374* (2019.01); *G01R 31/367* (2019.01); *G01R 31/388* (2019.01)

(58) Field of Classification Search
CPC ..... G01R 31/374; G01R 31/367; G01R 31/36
See application file for complete search history.

(56) References Cited

U.S. PATENT DOCUMENTS 6,300,763 B1 * 10/2001 Kwok .................... H01M 10/44 320/132
6,892,148 B2 5/2005 Barsoukov et al.
(Continued)

FOREIGN PATENT DOCUMENTS

CN 108663619 A 10/2018
JP 2019-90684 A 6/2019
(Continued)

OTHER PUBLICATIONS

Legrand, Nathalie, et al. "Including double-layer capacitance in lithium-ion battery mathematical models." *Journal of Power Sources* vol. 251 (2014). pp. 370-378.
(Continued)

*Primary Examiner* — Ricky Go
(74) *Attorney, Agent, or Firm* — Morgan, Lewis & Bockius LLP

(57) ABSTRACT

A method for adjusting a current of a battery includes obtaining one or more parameters of a battery including the current of the battery, a voltage and a temperature of the battery, determining a first correction parameter relating to a variation in current due to charging and discharging of the battery, based on at least a portion of the one or more parameters, determining a difference between an electrolyte concentration of an anode surface and an electrolyte concentration of a cathode surface of the battery, based on at least a portion of the one or more parameters, determining a temperature parameter based on the temperature of the battery, determining a second correction parameter relating to a temperature of the battery, based on the difference and the temperature parameter, and determining a correction value for the current of the battery based on the first correction parameter and the second correction parameter.

19 Claims, 11 Drawing Sheets

(56) References Cited

U.S. PATENT DOCUMENTS

| | | | | |
|---|---|---|---|---|
| 8,117,857 | B2 | 2/2012 | Kelty et al. | |
| 8,508,191 | B2 | 8/2013 | Kim et al. | |
| 8,754,611 | B2 | 6/2014 | Greening et al. | |
| 10,788,536 | B2 | 9/2020 | Zhang et al. | |
| 11,209,490 | B2 * | 12/2021 | Frenzel | G01R 35/005 |
| 2014/0159736 | A1 | 6/2014 | Morimoto et al. | |
| 2014/0333317 | A1 | 11/2014 | Frost et al. | |
| 2018/0143254 | A1 | 5/2018 | Kim et al. | |
| 2019/0146038 | A1 | 5/2019 | Matsumoto et al. | |
| 2021/0116510 | A1 | 4/2021 | Kim et al. | |
| 2022/0065934 | A1 * | 3/2022 | Kim | G01R 31/367 |
| 2023/0036063 | A1 * | 2/2023 | Cao | G02F 1/163 |

FOREIGN PATENT DOCUMENTS

| | | | |
|---|---|---|---|
| KR | 10-2018-0057202 | A | 5/2018 |
| KR | 10-2021-0047682 | A | 4/2021 |
| KR | 10-2022-0087810 | A | 6/2022 |

OTHER PUBLICATIONS

Yi, Jaeshin, et al. "Modeling of the transient behaviors of a lithium-ion battery during dynamic cycling." *Journal of Power Sources* vol. 277 (2015). pp. 379-386.

Korean Office Action issue on Jan. 13, 2025 in corresponding Korean Patent Application No. 10-2022-0137606 (8 pages in English and 11 pages in Korean).

* cited by examiner

METHOD AND APPARATUS FOR ADJUSTING VALUE OF CURRENT OF BATTERY

CROSS-REFERENCE TO RELATED APPLICATIONS

This application claims the benefit under 35 USC § 119(a) of Korean Patent Application No. 10-2022-0137606, filed on Oct. 24, 2022, at the Korean Intellectual Property Office, the entire disclosure of which is incorporated herein by reference for all purposes.

BACKGROUND

1. Field

The following description relates to methods and apparatuses for adjusting a value of a current that is applied to a battery model representing an internal state of a battery.

2. Description of Related Art

A battery model may be used to estimate an internal state of a battery. For example, values of factors applied to the battery model for estimating the internal state of the battery may be values measured by a sensor and/or predicted based on a previous internal state of the battery. Among the values of the factors applied to the battery model, the value of current applied to the battery may be a value of apparent current, such as a value of charging current for charging the battery or a value of discharge current that is output by the battery. Depending on the internal state of the battery, there may be a difference between the value of the current operating inside the battery and the value of the apparent current. Accuracy of the internal state of the battery estimated by the battery model may decrease due to the difference between the value of the current operating inside the battery and the value of the apparent current.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of adjusting a value of a current of a battery, performed by an electronic device, the method including obtaining values of one or more basic parameters of a battery including the current of the battery, a voltage of the battery, and a temperature of the battery, determining a value of a first correction parameter relating to a variation in current due to charging and discharging of the battery, based on at least a portion of the value of the one or more basic parameters, determining a difference between an electrolyte concentration of an anode surface and an electrolyte concentration of a cathode surface of the battery, based on at least a portion of the value of the one or more basic parameters, determining a value of a temperature parameter based on the temperature of the battery, determining a value of a second correction parameter relating to a temperature of the battery, based on a variation of the difference and the value of the temperature parameter, and determining a correction value of the current of the battery by adjusting an initial value of the current, based on the value of the first correction parameter and the value of the second correction parameter.

The method may include applying the correction value to a battery model for estimating an internal state of the battery.

The battery model may be an electro-chemical model or an electro-circuit model.

The first correction parameter and the second correction parameter may relate to current accumulated in a double layer capacitor formed at an interface between an electrode and an electrolyte of the battery.

The current of the battery may include any one of a charging current input to the battery in response to the battery being charged, or a discharge current supplied by the battery in response to the battery being discharged.

The determining of the value of the first correction parameter may include determining the value of the first correction parameter based on a capacitance per electrode area of the battery, a total electrode area of the battery, and a change rate of a voltage of the battery.

The determining of the difference between the electrolyte concentration of the anode surface and the electrolyte concentration of the cathode surface of the battery may include determining a change in a concentration distribution of the electrolyte of the battery, based on at least a portion of the value of the one or more basic parameters, and determining the difference between the electrolyte concentration of the anode surface and the electrolyte concentration of the cathode surface of the battery, based on the change in the concentration distribution of the electrolyte of the battery.

A first value of the temperature parameter determined with respect to a first temperature of the battery may be greater than or equal to a second value of the temperature parameter determined with respect to a second temperature that is higher than the first measured temperature.

The method may include determining whether a variation in the current is greater than or equal to a threshold variation, and applying the value of the one or more basic parameters to the battery model for estimating the internal state of the battery, in response to the variation not being greater than or equal to the threshold variation.

The value of the first correction parameter and the value of the second correction parameter may be determined, in response to the variation being greater than or equal to the threshold variation.

The battery may be included in a mobile terminal.

The battery may be included in a vehicle.

The difference between the electrolyte concentration of the anode surface and the electrolyte concentration of the cathode surface may be determined by applying any one or any combination of the current of the battery, the voltage of the battery, the temperature of the battery a diffusion coefficient of the electrolyte, and a prior concentration distribution of the electrolyte to a battery model.

In another general aspect, there is provided an electronic device for adjusting a value of a current of a battery, the electronic device including a memory configured to store a program, and a processor configured to execute the program to configure the electronic device to obtain values of one or more basic parameters of a battery including the current of the battery, a voltage of the battery, and a temperature of the battery, determine a value of a first correction parameter relating to a variation in current due to charging and discharging of the battery, based on at least a portion of the values of the one or more basic parameters, determine a difference between an electrolyte concentration of an anode surface and an electrolyte concentration of a cathode surface of the battery, based on at least a portion of the values of the one or more basic parameters, determine a value of a temperature parameter based on the measured temperature of the battery, determine a value of a second correction parameter relating to a temperature of the battery, based on a variation of the difference and the value of the temperature parameter, and determine a correction value of the current by adjusting an initial value of the current, based on the value of the first correction parameter and the value of the second correction parameter.

In another general aspect, there is provided a processor-implemented method of adjusting a value of a current of a battery, the method including obtaining values of one or more basic parameters of a battery including the current of the battery and a temperature of the battery, determining a value of a voltage of the battery based on at least a portion of the one or more basic parameters, determining a value of a first correction parameter relating to a change in current due to charging and discharging of the battery, based on at least a portion of the values of the one or more basic parameters and the value of the voltage of the battery, determining a difference between an electrolyte concentration of an anode surface and an electrolyte concentration of a cathode surface of the battery, based on at least a portion of the values of the one or more basic parameters, determining a value of a temperature parameter based on the temperature of the battery, determining a value of a second correction parameter relating to a temperature of the battery, based on a variation of the difference and the value of the temperature parameter, and determining a correction value of the current by adjusting an initial value of the current, based on the value of the first correction parameter and the value of the second correction parameter.

The method may include applying the correction value to a battery model for estimating an internal state of the battery.

The first correction parameter and the second correction parameter may relate to current accumulated in a double layer capacitor formed at an interface between an electrode and an electrolyte of the battery.

The current of the battery may include any one of a charging current input to the battery in response to the battery being charged, or a discharge current supplied by the battery in response to the battery being discharged.

The determining of the value of the first correction parameter may include determining the value of the first correction parameter based on a capacitance per electrode area of the battery, a total electrode area of the battery, and a change rate of a voltage of the battery.

The method may include determining whether a variation in the current is greater than or equal to a threshold variation, and applying the values of the one or more basic parameters to the battery model for estimating the internal state of the battery, in response to the variation not being greater than or equal to the threshold variation.

Other features and aspects will be apparent from the following detailed description, the drawings, and the claims.

Figure 1:
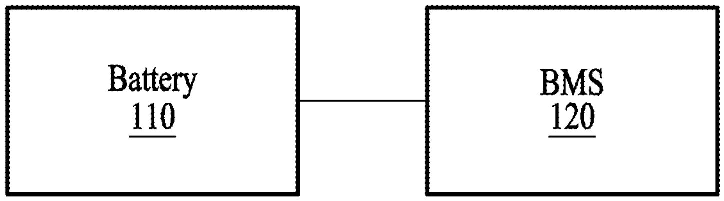
FIG. 1 illustrates an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third", or A, B, (a), (b), and the like may be used herein to describe various members, components, regions, layers, portions, or sections, these members, components, regions, layers, portions, or sections are not to be limited by these terms. Each of these terminologies is not used to define an essence, order, or sequence of corresponding members, components, regions, layers, portions, or sections, for example, but used merely to distinguish the corresponding members, components, regions, layers, portions, or sections from other members, components, regions, layers, portions, or sections. Thus, a first member, component, region, layer, portions, or section referred to in the examples described herein may also be referred to as a second member, component, region, layer, portions, or section without departing from the teachings of the examples.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing. As used herein, the term "and/or" includes any and all combinations of one or more of the associated listed items. For example, "A and/or B" may be interpreted as "A," "B," or "A and B."

The terminology used herein is for the purpose of describing particular examples only and is not to be limiting of the examples. The singular forms "a," "an," and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the examples with reference to the accompanying drawings, like reference numerals refer to like constituent elements and a repeated description related thereto will be omitted. In the description of the examples, a detailed description of well-known related structures or functions will be omitted when it is deemed that such description will cause ambiguous interpretation of the present disclosure.

The same name may be used to describe an element included in the examples described above and an element having a common function. Unless otherwise mentioned, the descriptions of the examples may be applicable to the following examples and thus, duplicated descriptions will be omitted for conciseness.

FIG. 1 illustrates an example of a battery system.

Referring to FIG. 1, a battery 110 may be one or more battery cells, battery modules, or battery packs. The battery 110 may include a capacitor, a secondary battery, or a lithium-ion battery for storing power as a result of charging. A device employing the battery 110 may receive power from the battery 110.

In some examples, a battery management system (BMS) 120 charges the battery 110 using a battery model. For example, the BMS 120 may fast charge the battery 110 in a multi-step charging manner that minimizes charging aging using an estimate of the internal state of the battery based on the battery model. In some examples, the battery model may be an electrochemical model or an electro-circuit model to which aging parameters of the battery 110 are applied to estimate state information of the battery 110 by modeling internal physical phenomena such as, for example, storage capacity, energy density, specific power, cell voltage, state of charge, state of cycle life, depth of discharge, potential and ion concentration distribution of the battery 110. In addition, the internal state of the battery 110 may include any one or any combination of parameters, such as, for example, a cathode lithium ion concentration distribution, an anode lithium ion concentration distribution, an electrolyte lithium ion concentration distribution, a cathode potential, and an anode potential of the battery 110. For example, the aging parameters may include any one or any combination of parameters, such as, for example, an electrode balance shift (EBS), a capacity for cathode active material, and an anode surface resistance of the battery 110. However, examples are not limited thereto.

The BMS 120 may divide the charging process into several charging stages (or steps) and charge the battery 110 with a charging current corresponding to each charging stage. For each of the charging stages, a charging limit condition for limiting charging of the battery 110 by a target charging capacity during a target charging time while preventing aging of the battery 110 may be set.

For example, the charging limit condition may include internal state conditions of the battery 110 for the respective charging stages. In some examples, the internal state conditions may be defined by the electrochemical model based on at least one internal state that affects the aging of the battery 110. The internal state conditions may include any one or any combination of conditions, such as, for example, an anode overpotential condition, a cathode overpotential condition, an anode surface lithium ion concentration condition, a cathode surface lithium ion concentration condition, a cell voltage condition, and a state of charge (SOC) condition for the battery 110.

Since the battery 110 may be aged when one of the internal state conditions is reached as the battery 110 is charged, the BMS 120 may control the charging of the battery 110 using the internal state conditions. For example, if it is determined that the battery 110 is aged when the anode overpotential of the battery 110 falls below 0.05 volts (V), the anode overpotential condition may be set based on 0.05 V. Aging conditions are conditions that cause aging when an internal state of the battery 110 is reached. Here, the anode overpotential of 0.05 V may be an aging condition that causes aging when the anode overpotential of the battery 110 is reached. However, the internal state conditions are not limited to the examples above, and various expressions quantifying the internal states that affect the aging of the battery 110 may be employed.

Overpotential is a voltage drop caused by departing from the equilibrium potential associated with an intercalation/deintercalation reaction at each electrode of the battery 110. The lithium ion concentration described above is a concentration of lithium ions when the lithium in the active material of each electrode of the battery. Materials other than lithium ions may be employed as the material in the active material.

An SOC is a parameter indicating a charging state of the battery 110. The SOC indicates an amount of energy stored in the battery 110, and the amount may be expressed in percent (%), for example, indicated as 0% to 100%. For example, 0% may indicate a fully discharged state, and 100% may indicate a fully charged state. Such a metric may be variously modified in varied examples. The SOC may be estimated or measured using various schemes.

The battery 110 may include two electrodes (cathode and anode) for intercalation/deintercalation of lithium ions, an electrolyte that is a medium through which lithium ions may move, a separator that physically separates the cathode and the anode to prevent direct flow of electrons but to allow ions to pass therethrough, and a collector that collects electrons generated by an electrochemical reaction or supplies electrons required for an electrochemical reaction. The cathode may include a cathode active material, and the anode may include an anode active material. For example, lithium cobalt oxide ($LiCoO2$) may be used as the cathode active material, and graphite ($C6$) may be used as the anode active material. Lithium ions move from the cathode to the anode while the battery 110 is charged, and lithium ions move from the anode to the cathode while the battery 110 is discharged. Thus, the concentration of lithium ions in the cathode active material and the concentration of lithium ions in the anode active material changes when charging and discharging the battery.

The electrochemical model may be employed in various manners to express the internal state of the battery 110. For example, a single particle model (SPM) and various application models may be employed for the electrochemical model, and parameters defining the electrochemical model may be variously modified. In some examples, the internal state conditions may be derived from the electrochemical model of the battery 110. Different techniques of defining the internal state conditions may be used.

In some examples, values of factors applied to the battery model to estimate the internal state of the battery 100 may be values measured by sensors and/or values predicted based on previous internal states of the battery. For example, among the values of factors applied to the battery model, the value of current applied to the battery may be a value of apparent current, such as a value of charging current for charging the battery or a value of discharge current output by the battery. Depending on the internal state of the battery, there may be a difference between the value of the current operating inside the battery and the value of the apparent current. For example, a double layer capacitor may be present at an interface between an electrode of a battery and an electrolyte, and a non-faradaic current may be generated as charges are accumulated in the double layer capacitor. A difference between the value of the current operating inside the battery and the value of the apparent current may occur due to the non-faradaic current.

A method of adjusting a value of a current applied of a battery will be described in detail with reference to FIGS. 2 to 11 below.

Figure 2A:
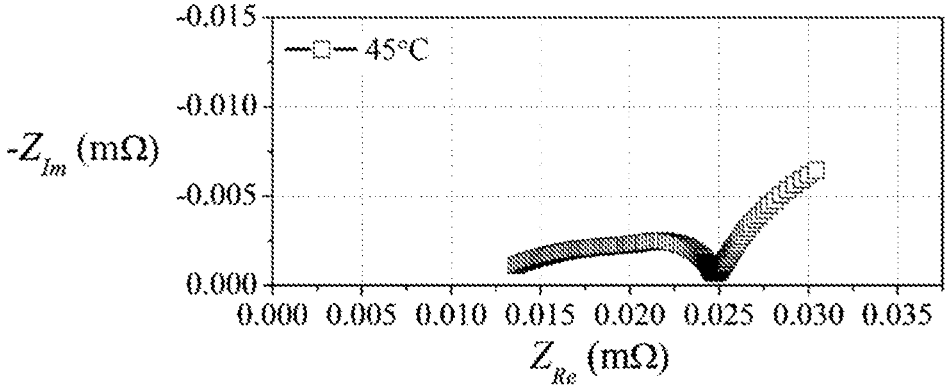
FIG. 2A illustrates an example of electrochemical impedance spectroscopy (EIS) measured when the temperature of a battery is 45° C.
Figure 2B:
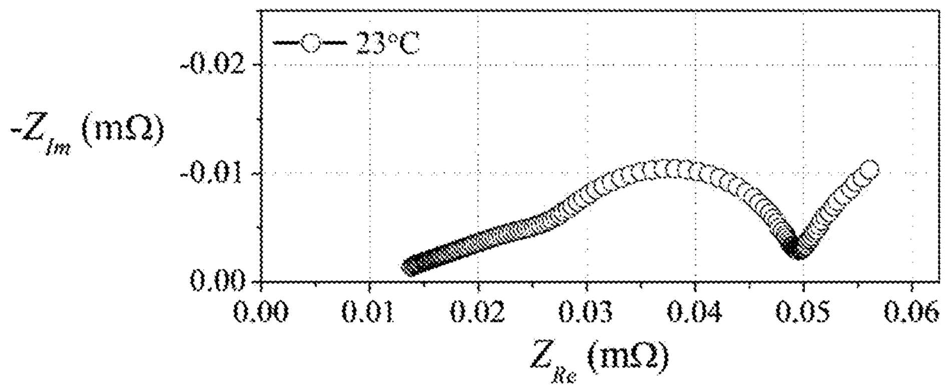
FIG. 2B illustrates an example of EIS measured when the temperature of a battery is 23° C.
Figure 2C:
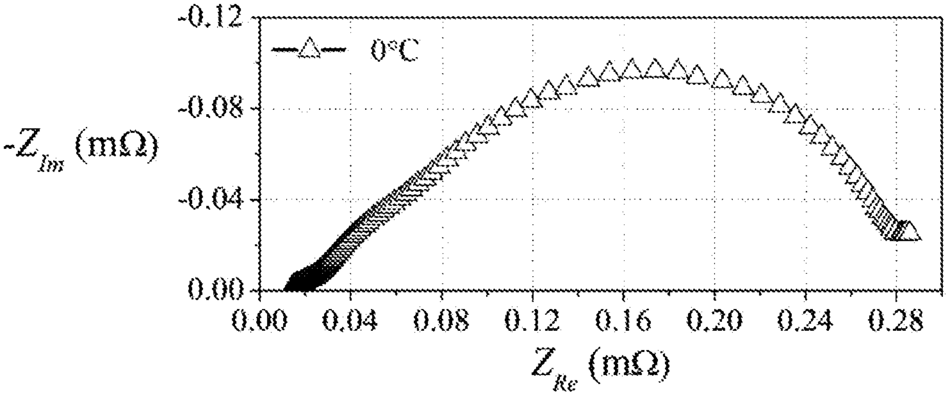
FIG. 2C illustrates an example of EIS measured when the temperature of a battery is 0° C.

FIG. 2A illustrates an example of a Nyquist plot for electrochemical impedance spectroscopy (EIS) measured when the temperature of a battery is 45° C., FIG. 2B illustrates an example of a Nyquist plot for EIS measured when the temperature of a battery is 23° C., and FIG. 2C illustrates an example of a Nyquist plot for EIS measured when the temperature of a battery is 0° C.

When a current is applied to an electrochemical device, a faradaic current may be generated in which charges are transferred to the outside and a non-faradaic current may be generated in which the charges are collected on the surface of an electrode but are not transferred to the outside. For example, the non-faradaic current may be a current that is generated in a process of charges being accumulated in a double layer capacitor formed at an interface between an electrode and an electrolyte.

In some examples, since an amount of charge accumulated in the double layer capacitor of a battery is lesser than an amount of charge generated due to a faradaic current, the effect of a non-faradaic current may be ignored when the state of the battery is simulated using an electrochemical model. Non-faradaic current occurs for a relatively short period of time when a voltage change due to an applied current is large, so when a resistance of a device is small, or when the magnitude of an applied current is small, or when a voltage variation per time is small, the effect of the non-faradaic current on an estimated state of a battery may not be significant.

In an example, as the temperature of a battery decreases, the time during which the non-faradaic current generated in the double layer capacitor flows may increase. For example, as illustrated in FIGS. 2A-2C, when the temperature of a battery is 45° C., the effect of capacitance due to the double layer capacitor may disappear at a point of 0.025Ω according to a result of an EIS measurement. In another example, when the temperature of a battery is 23° C., the effect of capacitance due to the double layer capacitor may disappear at a point of 0.05Ω according to a result of an EIS measurement. In yet another example, when the temperature of a battery is 0° C., the effect of capacitance due to the double layer capacitor may disappear at a point of 0.28Ω according to a result of an EIS measurement.

A description of the frequency corresponding to the corresponding points and the time at which the effect of capacitance by the double layer capacitor corresponding to the frequency disappears is further described with reference to FIG. 3 below.

Figure 3:
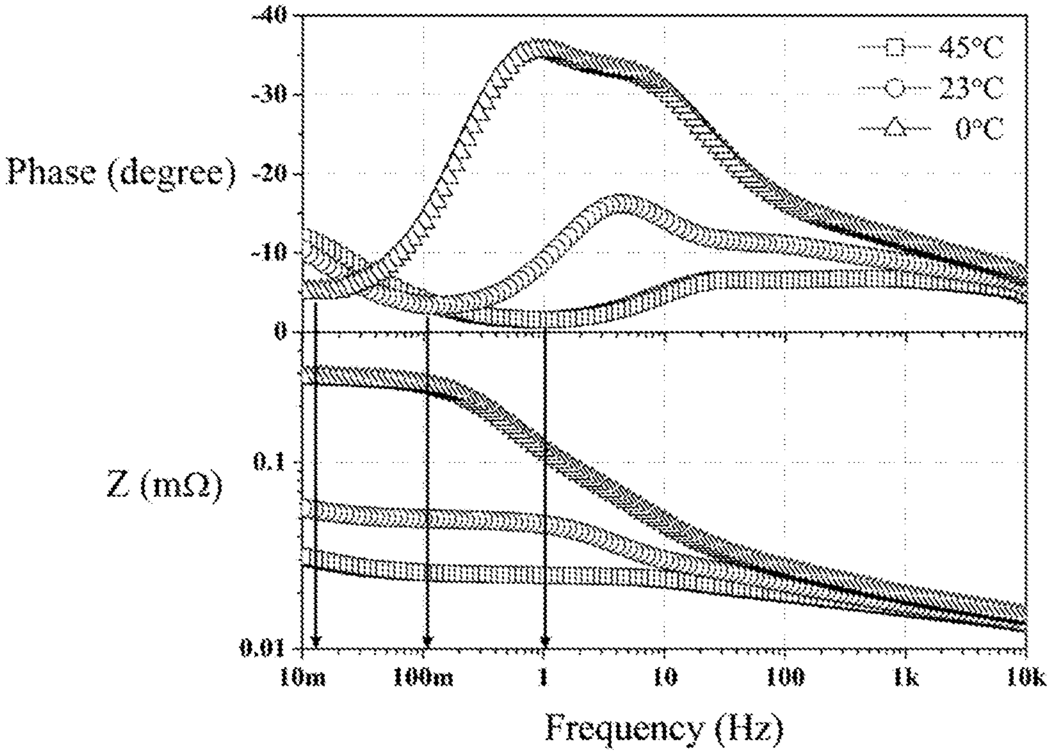
FIG. 3 illustrates an example of an effect of reduced resistance by a double layer capacitor at various temperatures of a battery.

FIG. 3 illustrates an example of a Bode plot for showing an effect of reduced resistance by a double layer capacitor at various temperatures of a battery.

In the examples described above with reference to FIGS. 2A, 2B, and 2C, the frequencies corresponding to the points of 0.025Ω, 0.05Ω, and 0.28Ω when the temperatures of the battery are 45° C., 23° C., and 0° C., may be 1 Hz, 100 mHz, and 10 mHz, respectively, which are points where the phase is closest to zero. According to the result of the Bode plot illustrated in FIG. 3, for example, when the temperature of the battery is 45° C., the time required for the effect of the capacitance due to the double layer capacitor to disappear may be 1 second. In another example, when the temperature of the battery is 23° C., the time required for the effect of the capacitance due to the double layer capacitor to disappear may be 10 seconds. In yet another example, when the temperature of the battery is 0° C., the time required for the effect of the capacitance due to the double layer capacitor to disappear may be 100 seconds.

In an example, a non-faradaic current $I_{NF}$ due to a double layer capacitor may be expressed by Equation 1 below.

$$I_{NF} = \frac{dQ_{DL}}{dt} = C_{DL} \times \frac{dV}{dt} \qquad \text{Equation 1}$$

In Equation 1, $Q_{DL}$ denotes an amount of charge that is charged in the double layer capacitor, $C_{DL}$ denotes a capacitance of the double layer capacitor, and V denotes the voltage of a battery. In the electrochemical model, Equation 1 may be applied to each of the cathode and the anode of the battery. The battery voltage may be a potential difference between the cathode and the anode. $Q_{DL}$ may be the amount of charge charged in the double layer capacitor of each active material of the cathode and the anode. $C_{DL}$ may be the capacitance of the double layer capacitor of the active material of each of the cathode and the anode. The non-faradaic current calculated using Equation 1 may be applied to a process for calculating each of a cathode surface reaction and an anode surface reaction of the battery through the electrochemical model.

In an example, the electrochemical model using Equation 1 may not reflect the time needed for the effect of the capacitance due to the double layer capacitor to disappear, which is described above with reference to FIGS. 2 and 3. A method of adjusting a value of an applied current of a battery so that the time needed for the effect of the capacitance due to the double layer capacitor to disappear is reflected will be described in detail with reference to FIGS. 4 to 11.

Figure 4:
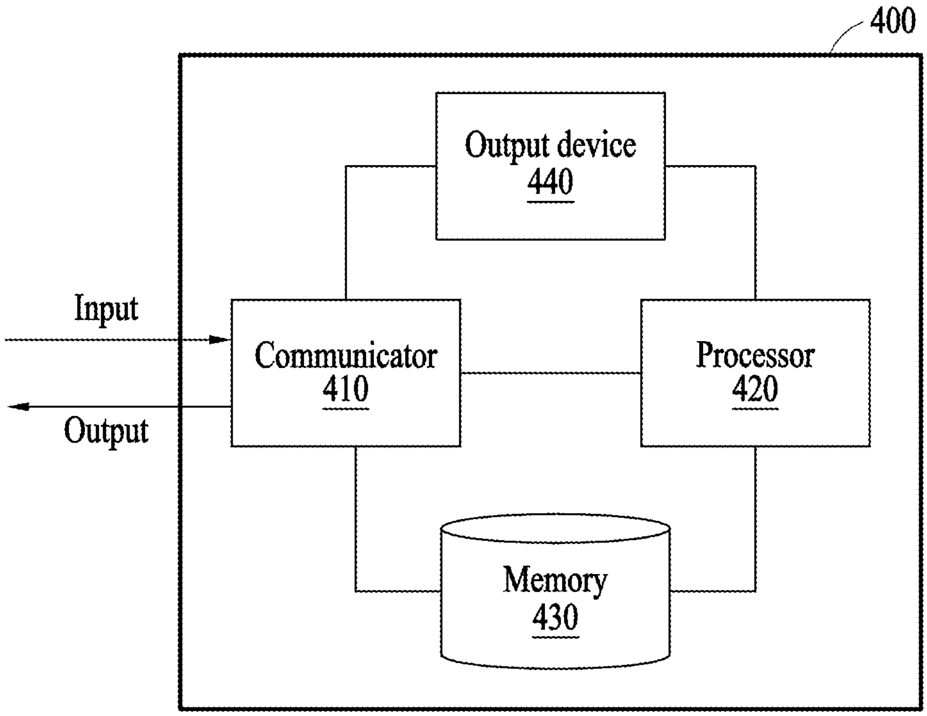
FIG. 4 illustrates an example of an electronic device.

FIG. 4 illustrates an example of an electronic device.

Referring to FIG. 4, an electronic device 400 for controlling a battery includes a communicator 410, a processor 420, a memory 430, and an output device 440. For example, the electronic device 400 may correspond to the BMS 120 described above with reference to FIG. 1.

In an example, the electronic device 400 may be included in a computing devices. The examples described below may be implemented as, or in, various types of computing devices, such as, a personal computer (PC), a data server, or a portable device. In an example, the portable device may be implemented as a laptop computer, a mobile phone, a smart phone, a tablet PC, a mobile internet device (MID), a personal digital assistant (PDA), an enterprise digital assistant (EDA), a digital still camera, a digital video camera, a portable multimedia player (PMP), a personal navigation device or portable navigation device (PND), a handheld game console, an e-book, a vehicle, an autonomous vehicles, an intelligent vehicles, or a smart device. In an example, the computing devices may be a wearable device, such as, for example, a smart watch and an apparatus for providing augmented reality (AR) (hereinafter simply referred to as an AR provision device) such as AR glasses, a head mounted display (HMD), various Internet of Things (IoT) devices that are controlled through a network, and other consumer electronics/information technology (CE/IT) devices. In another example, the electronic device 400 may be included in a vehicle.

Hereinafter, a vehicle may refer to any mode of transportation, delivery, or communication such as, for example, for example, an automobile, a truck, a tractor, a scooter, a motorcycle, a cycle, an amphibious vehicle, a snowmobile, a boat, a public transit vehicle, a bus, a monorail, a train, a tram, an autonomous vehicle, an unmanned aerial vehicle, a bicycle, a drone, and a flying object such as an airplane. In some examples, the vehicle may correspond to, for example, an autonomous vehicle, a smart mobility, an electric vehicle, an intelligent vehicle, an electric vehicle (EV), a plug-in hybrid EV (PHEV), a hybrid EV (HEV), or a hybrid vehicle, an intelligent vehicle equipped with an advanced driver assistance system (ADAS) and/or an autonomous driving (AD) system.

The communicator 410 may be connected to the processor 420 and the memory 430 and transmit and receive data to and from the processor 420 and the memory 430. The communicator 410 may be connected to another external device and transmit and receive data to and from the external device. Hereinafter, transmitting and receiving "A" may refer to transmitting and receiving "information or data indicating A."

The communicator 410 may be implemented as a circuitry in the electronic device 400. For example, the communicator 410 may include an internal bus and an external bus. In some examples, the communicator 410 may be an element that connects the electronic device 400 to the external device. In some examples, the communicator 410 may be an interface. In some examples, the communicator 410 may receive data from the external device and transmit the data to the processor 420 and the memory 430.

The processor 420 may process the data received by the communicator 410 and data stored in the memory 430. The processor 420 may perform the operations of the BMS 120. The processor 420 may control an overall operation of the BMS 120 and may execute corresponding processor-readable instructions for performing operations of the electronic device 400. The processor 420 may execute, for example, software, to control one or more hardware components, such as other components described below in FIG. 4, of the electronic device 400 connected to the processor 420 and may perform various data processing or operations, and control of such components.

In an example, as at least a part of data processing or operations, the processor 420 may store instructions or data in the memory 430, execute the instructions and/or process data stored in the memory 430, and store resulting data obtained therefrom in the memory 430. The processor may be a data processing device implemented by hardware including a circuit having a physical structure to perform desired operations. For example, the desired operations may include code or instructions included in a program.

The hardware-implemented data processing device 420 may include, for example, a main processor (e.g., a central processing unit (CPU), a field-programmable gate array (FPGA), or an application processor (AP)) or an auxiliary processor (e.g., a GPU, a neural processing unit (NPU), an image signal processor (ISP), a sensor hub processor, or a communication processor (CP)) that is operable independently of, or in conjunction with the main processor. Further details regarding the processor 1110 are provided below.

The processor 420 may execute computer-readable code (e.g., software) stored in a memory (e.g., the memory 430) and instructions triggered by the processor 420.

The memory 430 may store the data received by the communicator 410 and data processed by the processor 420. For example, the memory 430 may store the program (or an application, or software). For example, the stored program may be a set of syntaxes that are coded and executable by the processor 420 to adjust a value of an applied current for a battery. The memory 430 may include any one or any combination of a volatile memory and a non-volatile memory.

The volatile memory device may be implemented as a dynamic random-access memory (DRAM), a static random-access memory (SRAM), a thyristor RAM (T-RAM), a zero capacitor RAM (Z-RAM), or a twin transistor RAM (TTRAM).

The non-volatile memory device may be implemented as an electrically erasable programmable read-only memory (EEPROM), a flash memory, a magnetic RAM (MRAM), a spin-transfer torque (STT)-MRAM, a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate Memory (NFGM), a holographic memory, a molecular electronic memory device), or an insulator resistance change memory. Further details regarding the memory 1120 are provided below.

The memory 430 may store an instruction set (e.g., software) for operating the electronic device 400. The instruction set for operating the electronic device 400 is executed by the processor 420.

In some examples, the processor 420 may output an applied current of the battery, a measured voltage of the battery, and a measured temperature of the battery, electrolyte concentration of an anode surface of the battery, an electrolyte concentration of a cathode surface, a first correction parameter, a second correction parameter, and a correction value of the applied current to the output device 440. In some examples, the output device 440 may provide an output to a user through auditory, visual, or tactile channel. The output device 440 may include, for example, a speaker, a display, a touchscreen, a vibration generator, and other devices that may provide the user with the output. The output device 440 is not limited to the example described above, and any other output device, such as, for example, computer speaker and eye glass display (EGD) that are operatively connected to the electronic device 400 may be used without departing from the spirit and scope of the illustrative examples described. In an example, the output device 440 is a physical structure that includes one or more hardware components that provide the ability to render a user interface, output information and speech, and/or receive user input.

The communicator 410, the processor 420, and the memory 430 will be described further below with reference to FIGS. 5 and 11.

Figure 5:
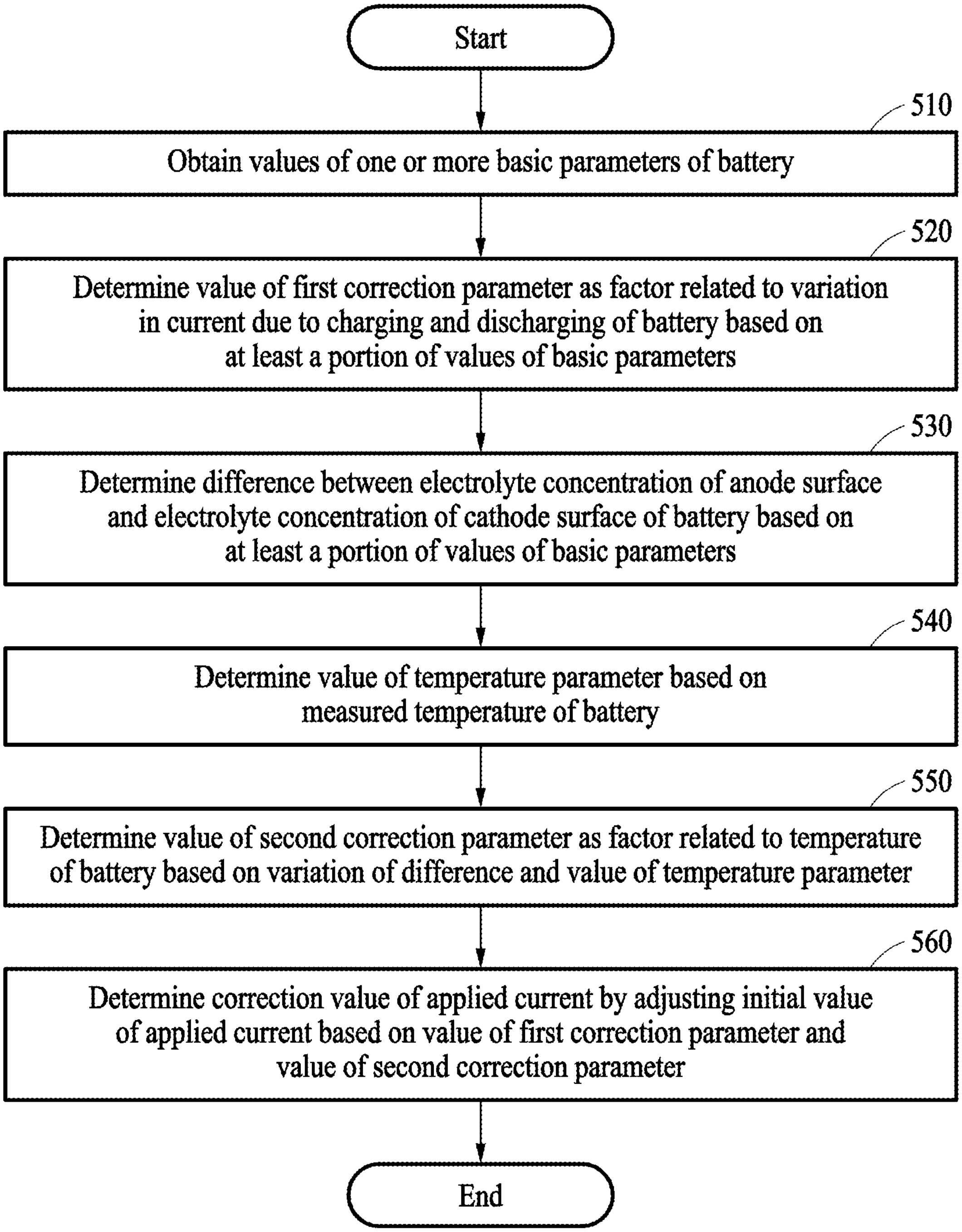
FIG. 5 illustrates an example of a method of adjusting a value of an applied current of a battery.

FIG. 5 illustrates an example of a method of adjusting a value of an applied current of a battery. The operations of FIG. 5 may be performed in the sequence and manner as shown. However, the order of some operations may be changed, or some of the operations may be omitted, without departing from the spirit and scope of the shown example. Additionally, operations illustrated in FIG. 5 may be performed in parallel or simultaneously. One or more blocks of FIG. 5, and combinations of the blocks, can be implemented by special purpose hardware-based computer that perform the specified functions, or combinations of special purpose hardware and instructions, e.g., computer or processor instructions. For example, operations 510 through 550 may be performed by the electronic device 400 described above with reference to FIG. 4. In addition to the description of FIG. 5 below, the descriptions of FIGS. 1-4 are also applicable to FIG. 5 and are incorporated herein by reference. Thus, the above description may not be repeated here for brevity purposes.

In operation 510, the electronic device 400 may obtain values of one or more basic parameters of a battery connected to the electronic device 400. For example, the basic parameters may include an applied current of the battery and a temperature of the battery. In another example, the basic parameters may further include a measured voltage of the battery. The values of the basic parameters may be measured through one or more sensors.

In an example, an applied current of the battery may be an apparent current such as a charging current for charging the battery or a discharge current that is output by the battery. For example, when a battery is being charged, an applied current of the battery may be a charging current input to the battery. For example, when a battery is being discharged, the applied current of the battery may be a discharge current supplied by the battery.

In an example, a measured temperature of the battery may be the temperature measured by a temperature sensor disposed around or inside the battery. For example, the measured temperature of the battery may be the temperature of a surface of the battery or the temperature of an electrode of the battery, but is not limited to the described examples. In operation 520, the electronic device 400 may determine a value of a first correction parameter as a factor related to a variation in current due to charging and discharging of the battery. The first correction parameter may be based on at least a portion of the values of the basic parameters. For example, a value of the basic parameter used to determine the value of the first correction parameter may be a measured voltage.

In an example, the electronic device 400 may determine a value of the first correction parameter based on a capacitance per electrode area of the battery, a total electrode area of the battery, and a rate of change of the battery voltage. For example, the value of the first correction parameter may be determined using Equation 2.

$$I_{DL1} = -C_{DL} \times \text{Area} \times \frac{dV}{dt} \qquad \text{Equation 2}$$

In Equation 2, $I_{DL1}$ denotes the value of the first correction parameter, Area denotes the electrode area of the battery, $C_{DL}$ denotes capacitance of the double layer capacitor, and V denotes the measured voltage of the battery. For example, $C_{DL}$ may vary depending on battery characteristics within a range of 1 to 500 F/m2, and may be effective in a range of 40 to 80 F/m2. An increase in $I_{DL1}$ according to a change in voltage (or applied voltage) may indicate an increase in a non-faradaic current flowing through the double layer capacitor.

In operation 530, the electronic device 400 may determine a difference C e between an electrolyte concentration $C_{e,n}$ of an anode surface and an electrolyte concentration $C_{e,p}$ of a cathode surface of the battery based on at least a portion of the values of the basic parameters.

In an example, the electronic device 400 may calculate a change in concentration distribution of the electrolyte based on an applied current of the battery, a measured temperature of the battery, a diffusion coefficient of the electrolyte, and an existing concentration distribution of the electrolyte. The electronic device 400 may determine a difference $C_e$ between an electrolyte concentration $C_{e,n}$ of an anode surface and an electrolyte concentration $C_{e,p}$ of a cathode surface of the battery based on a change in the concentration distribution of the electrolyte.

In an example, a battery model may be used to determine the difference between the electrolyte concentration on the anode surface and the electrolyte concentration on the cathode surface. For example, to quickly determine the difference between electrolyte concentrations, a light-weight battery model may be used to calculate only the difference between electrolyte concentrations rather than the entire internal state of the battery.

In operation 540, the electronic device 400 may determine a value of a temperature parameter based on the measured temperature of the battery.

In an example, the electronic device 400 may determine the value of the temperature parameter by using a temperature function for determining the value of the temperature parameter corresponding to the measured temperature.

In some example, the temperature function may be a pre-fitted function to output a greater value of the temperature parameter at a lower temperature. In some examples, when the second measured temperature is higher than the first measured temperature, a first value of the temperature parameter determined with respect to a first measured temperature of the battery may be greater than or equal to a second value of the temperature parameter determined with respect to a second measured temperature. For example, as the measured temperature of the battery increases, the value of the temperature parameter output by the temperature function may converge to zero. For example, as the measured temperature of the battery decreases, the value of the temperature parameter output by the temperature function may increase or converge to a predetermined value.

In operation 550, the electronic device 400 may determine a value of a second correction parameter as a factor related to the temperature of the battery, based on a variation of a difference $C_e$ between an electrolyte concentration $C_{e,n}$ of an anode surface and an electrolyte concentration $C_{e,p}$ of a cathode surface of the battery and a value of the temperature parameter.

In an example, the value of the second correction parameter may be calculated using Equation 3.

$$I_{DL2} = F_T \times \frac{d(C_e)}{dt} \qquad \text{Equation 3}$$

In Equation 3, $I_{DL2}$ denotes the value of the second correction parameter, $F_T$ may denote the value of the temperature parameter, $C_e$ denotes a difference between an electrolyte concentration $C_{e,n}$ of the anode surface and an electrolyte concentration $C_{e,p}$ of the cathode surface of the battery.

In an example, since the value of the temperature parameter decreases as the temperature of the battery increases, $I_{DL2}$ may decrease as the temperature of the battery increases.

In an example, as the variation of the difference $C_e$ between the electrolyte concentrations increases (for example, as the variation in current or voltage increases) when the value of the temperature parameter is the same, $I_{DL2}$ may increase. An increase in $I_{DL2}$ may indicate an increase in a non-faradaic current flowing through the double layer capacitor.

In operation 560, the electronic device 400 may determine a correction value of an applied current by adjusting an initial value of the applied current based on the value of the first correction parameter and the value of the second correction parameter.

In an example, the correction value of the applied current may be calculated using Equation 4 below.

$$I_{net} = I_{applied} - (I_{DL1} + I_{DL2}) \qquad \text{Equation 4}$$

In Equation 4, $I_{net}$ denotes a correction value of the applied current, and $I_{applied}$ denotes an initial value of the applied current. The initial value of the applied current may be a value of an apparent current of the battery measured by a sensor.

In an example, the correction value of the applied current may be applied to a battery model for estimating (or simulating) an internal state of the battery. For example, the battery model may be an electrochemical model or an electro-circuit model to which aging parameters are applied.

The value of the first correction parameter and the value of the second correction parameter may be greater at the beginning of charging or discharging (when the variation in applied current or battery voltage is large). As the value of the first correction parameter increases and the value of the second correction parameter increases, the magnitude of the applied current may decrease, and as the magnitude of the applied current decreases, the expected voltage variation inside the battery may also decrease. The voltage variation inside the battery that is predicted based on the initial value of the applied current without considering the value of the first correction parameter and the value of the second correction parameter may be greater than the voltage variation inside the battery predicted considering the value of the first correction parameter and the value of the second correction parameter. In this example, since an expected voltage drop value is greater than the actual voltage drop value, accuracy of the estimation of the internal state of the battery may decrease. When the value of the first correction parameter and the value of the second correction parameter are considered, the effect of the non-faradaic current generated by the double layer capacitor generated at the electrode may be reflected in determining the internal state of the battery, so that the internal state of the battery may be accurately estimated.

Figure 6:
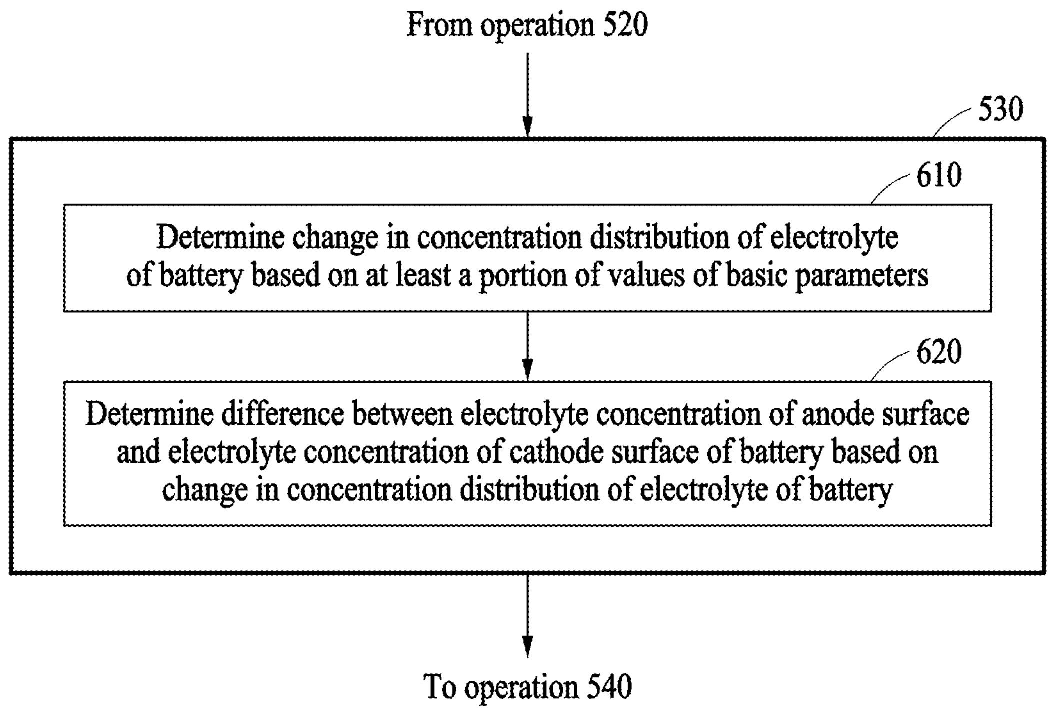
FIG. 6 illustrates an example of a method of determining a difference between an electrolyte concentration on an anode surface and an electrolyte concentration on a cathode surface of a battery.

FIG. 6 illustrates an example of a method of determining a difference between an electrolyte concentration on an anode surface and an electrolyte concentration on a cathode surface of a battery. The operations of FIG. 6 may be performed in the sequence and manner as shown. However, the order of some operations may be changed, or some of the operations may be omitted, without departing from the spirit and scope of the shown example. Additionally, operations illustrated in FIG. 6 may be performed in parallel or simultaneously. One or more blocks of FIG. 6, and combinations of the blocks, can be implemented by special purpose hardware-based computer that perform the specified functions, or combinations of special purpose hardware and instructions, e.g., computer or processor instructions. For example, operations 610 through 620 may be performed by the electronic device 400 described above with reference to FIG. 4. In addition to the description of FIG. 6 below, the descriptions of FIGS. 1-5 are also applicable to FIG. 6 and are incorporated herein by reference. Thus, the above description may not be repeated here for brevity purposes.

In an example, operation 530 described above with reference to FIG. 5 may include operations 610 and 620. Operations 610 and 620 may be performed by the electronic device 400 described above with reference to FIG. 4.

In operation 610, the electronic device 400 may determine a change in concentration of an electrolyte of a battery based on at least a portion of the values of the basic parameters. In some examples, the change in concentration of the electrolyte of the battery may correspond to a change in distribution of concentration of the electrolyte.

In an example, the electronic device 400 may calculate a change in concentration distribution of the electrolyte based on an applied current of the battery, a measured temperature of the battery, a diffusion coefficient of the electrolyte, and an existing concentration distribution of the electrolyte.

In an example, the electronic device 400 may determine a change in the concentration distribution of the electrolyte of the battery using at least a portion of the values of the basic parameters and a battery model. For example, to quickly determine the change in the concentration distribution of the electrolyte of the battery, a light-weight battery model may be used to calculate only the change in concentration distribution of the electrolyte of the battery rather than the entire internal state of the battery.

In operation 620, the electronic device 400 may determine a difference between an electrolyte concentration of an anode surface and an electrolyte concentration of a cathode surface of the battery based on the change in the concentration distribution of the electrolyte of the battery.

Figure 7:
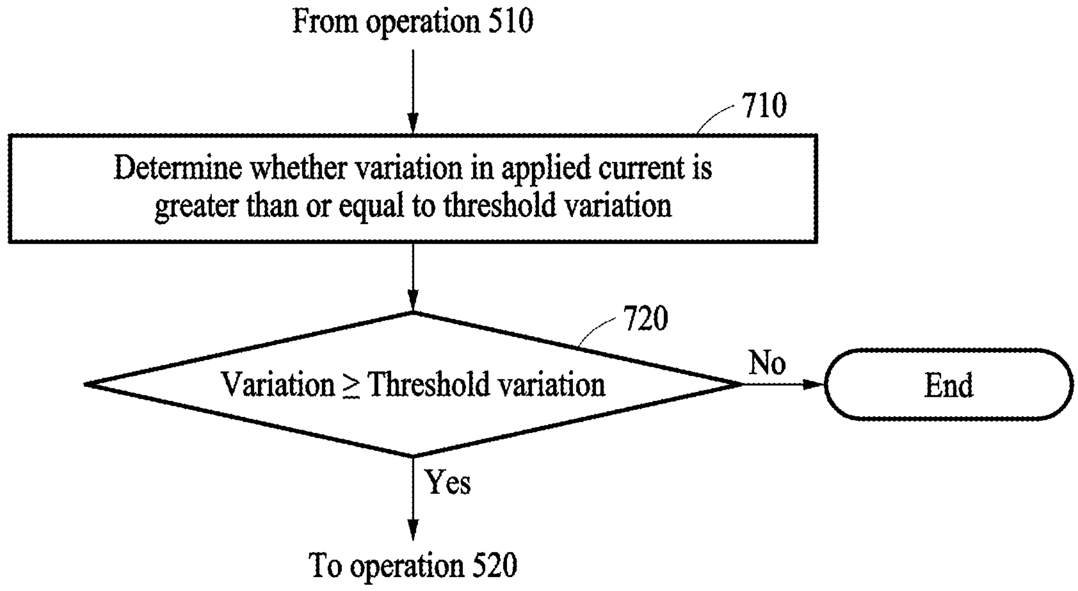
FIG. 7 illustrates an example of a method of determining a variation of an applied current.

FIG. 7 illustrates an example of a method of determining a variation of an applied current. The operations of FIG. 7 may be performed in the sequence and manner as shown. However, the order of some operations may be changed, or some of the operations may be omitted, without departing from the spirit and scope of the shown example. Additionally, operations illustrated in FIG. 7 may be performed in parallel or simultaneously. One or more blocks of FIG. 7, and combinations of the blocks, can be implemented by special purpose hardware-based computer that perform the specified functions, or combinations of special purpose hardware and instructions, e.g., computer or processor instructions. For example, operations 610 through 6200 may be performed by the electronic device 400 described above with reference to FIG. 4. In addition to the description of FIG. 7 below, the descriptions of FIGS. 1-6 are also applicable to FIG. 7 and are incorporated herein by reference. Thus, the above description may not be repeated here for brevity purposes.

In an example, operation 710 may be performed after operation 510 of FIG. 5 is performed. Operation 710 may be performed by the electronic device 400 described above with reference to FIG. 4.

In operation 710, the electronic device 400 may determine whether a variation in an applied current of a battery is greater than or equal to a threshold variation.

In some examples, when the value of the charging current for charging the battery is changed from the first value to the second value, the amount of change in the applied current may be determined. In an examples, when charging current is supplied to the battery in a non-charging state, a variation in the applied current may be calculated. In some examples, when a battery charging process is divided into several charging sections (or steps), the charging current corresponding to each charging section may be different, and the variation in the applied current may be determined when the charging section is changed.

In some examples, when a value of a discharge current for discharging a battery is changed from a first value to a second value, an amount of change in an applied current may be determined. For example, when a change occurs in the power used by the electronic device 400, the discharge current may change.

For example, when the electronic device 400 and a battery are included in a vehicle and the battery supplies power for driving the vehicle, a change may occur in the applied current when there is an increase or decrease in a speed of the vehicle. For example, when the vehicle rapidly accelerates or decelerates, variation in the applied current may be large.

For example, when the electronic device 400 and the battery are included in a mobile terminal and the battery supplies power to control the mobile terminal, a change may occur in the applied current when an application is executed by the mobile terminal. For example, when a game application with high performance characteristic is executed in the mobile terminal, the variation in the applied current may be large.

In operation 710, a determination is made whether a variation in the applied current of a battery is greater than or equal to a threshold variation. When the variation in the applied current of a battery is greater than or equal to a threshold variation, operation 520 described above with reference to FIG. 5 may be performed. The variation in the applied current may induce a variation in the non-faradaic current flowing in the double layer capacitor of the battery, and the faradaic current may vary due to the variation in the non-faradaic current. Since the variation in the faradaic current causes a difference between an actual voltage drop value and an expected voltage drop value, accuracy of the estimation of an internal state of the battery may decrease. When the variation in the applied current of the battery is greater than or equal to the threshold variation, the electronic device 400 may determine a correction value of the current applied to the battery model by performing operations 520 through 560. For example, when the variation in the applied current of the battery is greater than or equal to the threshold variation, a value of a first correction parameter and a value of a second correction parameter may be determined.

In an example, when the variation in the applied current of the battery is not greater than or equal to the threshold variation, the electronic device 400 may determine the internal state of the battery by applying an initial value of the applied current of the battery to the battery model. When a change does not occur in the applied current, a change may not occur in the non-faradaic current and may not occur in the faradaic current flowing in the double layer capacitor of the battery. In this example, since the difference between the actual voltage drop value and the expected voltage drop value may be small, accuracy of the estimation of the internal state of the battery based on the initial value of the applied current may be high. Estimating the internal state of the battery based on the initial value of the applied current may be faster in computational speed and require less computation compared to estimating the internal state of the battery based on the correction value of the applied current.

Figure 8A:
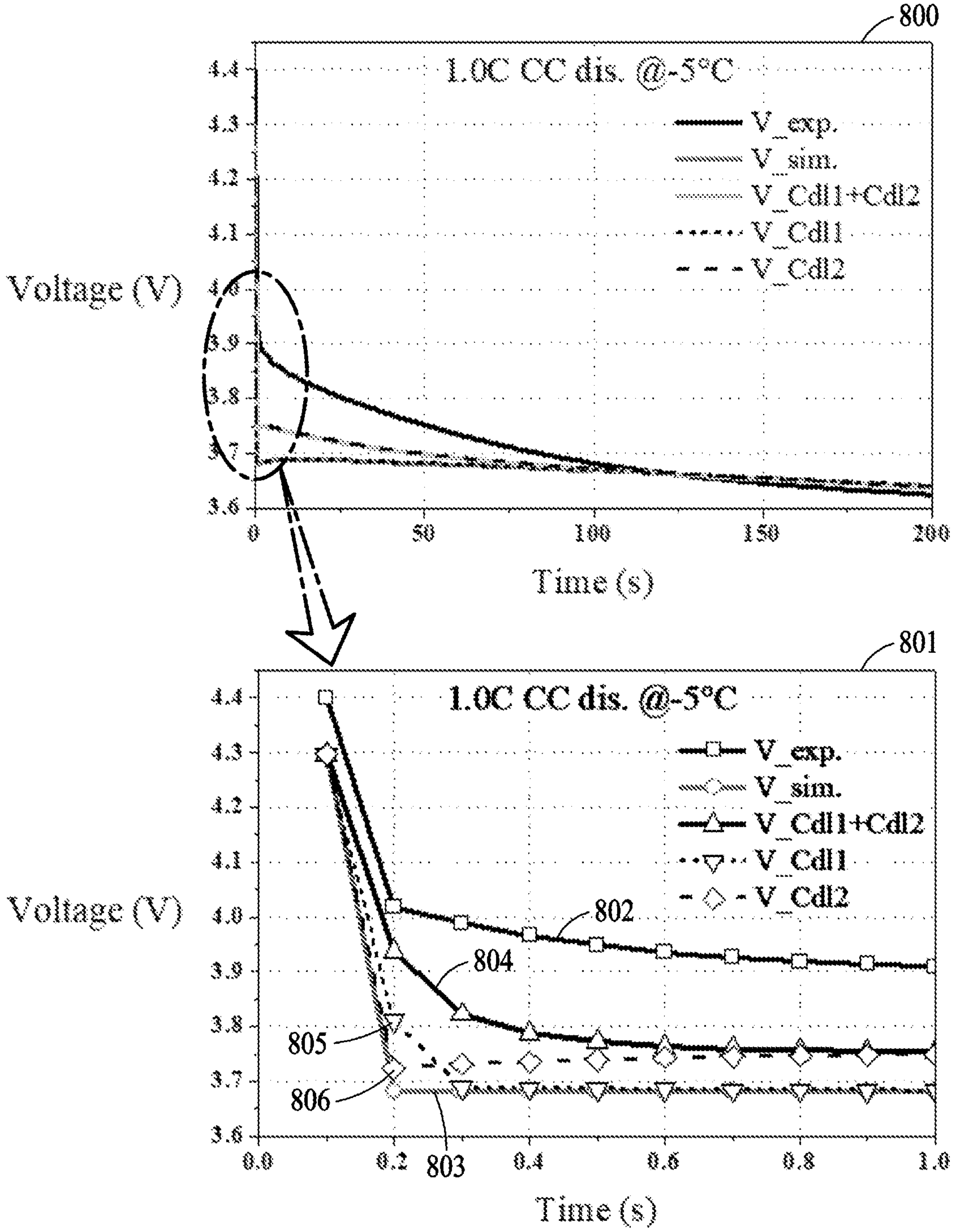
FIG. 8A illustrates an example of a voltage of a battery being measured and a voltage being estimated by a battery model, when a temperature of the battery is −5° C.

FIG. 8A illustrates an example of a voltage of a battery being measured and a voltage being estimated by a battery model, when a temperature of the battery is −5° C.

A first graph 800 shows an actual voltage of a battery and an estimated voltage estimated by a battery model for 0 seconds to 200 seconds when the battery temperature is −5° C. and a current of 1 A is discharged from the battery. A second graph 801 is a graph in which a part representing a period from 0 seconds to 1 second of the first graph 800 is enlarged.

A first curve 802 may represent an actual voltage of the battery. A second curve 803 may represent an estimated voltage of the battery obtained by applying an initial value of an applied current of the battery to a battery model. A third curve 804 may represent an estimated voltage of the battery obtained by applying a correction value of an applied current of a corrected battery to the battery model, based on a value of a first correction parameter and a value of a second correction parameter. A fourth curve 805 may represent an estimated voltage of the battery obtained by applying the correction value of the applied current of the corrected battery to the battery model, based on the value of the first correction parameter. A fifth curve 806 may represent an estimated voltage of the battery obtained by applying the correction value of the applied current of the corrected battery to the battery model, based on the value of the second correction parameter.

According to the first curve 802 of the second graph 801, the actual voltage of the battery drops rapidly in an initial period (e.g., a period from 0 seconds to 0.2 seconds) in which the applied current changes. For example, a dropped value of the estimated voltage of the battery obtained based on the initial value of the applied current may be greater than a dropped value of the actual voltage in the initial period. Since the estimated variation is greater than the actual variation of the voltage, the accuracy of the internal state of the battery determined based on the initial value of the applied current may decrease. For example, a dropped value of the estimated voltage of the battery obtained based on a correction value of the applied current may be similar to a dropped value of the actual voltage in the initial period. Since the actual variation and the estimated variation of the voltage are similar, the accuracy of the internal state of the battery determined based on the correction value of the applied current may increase.

Figure 8B:
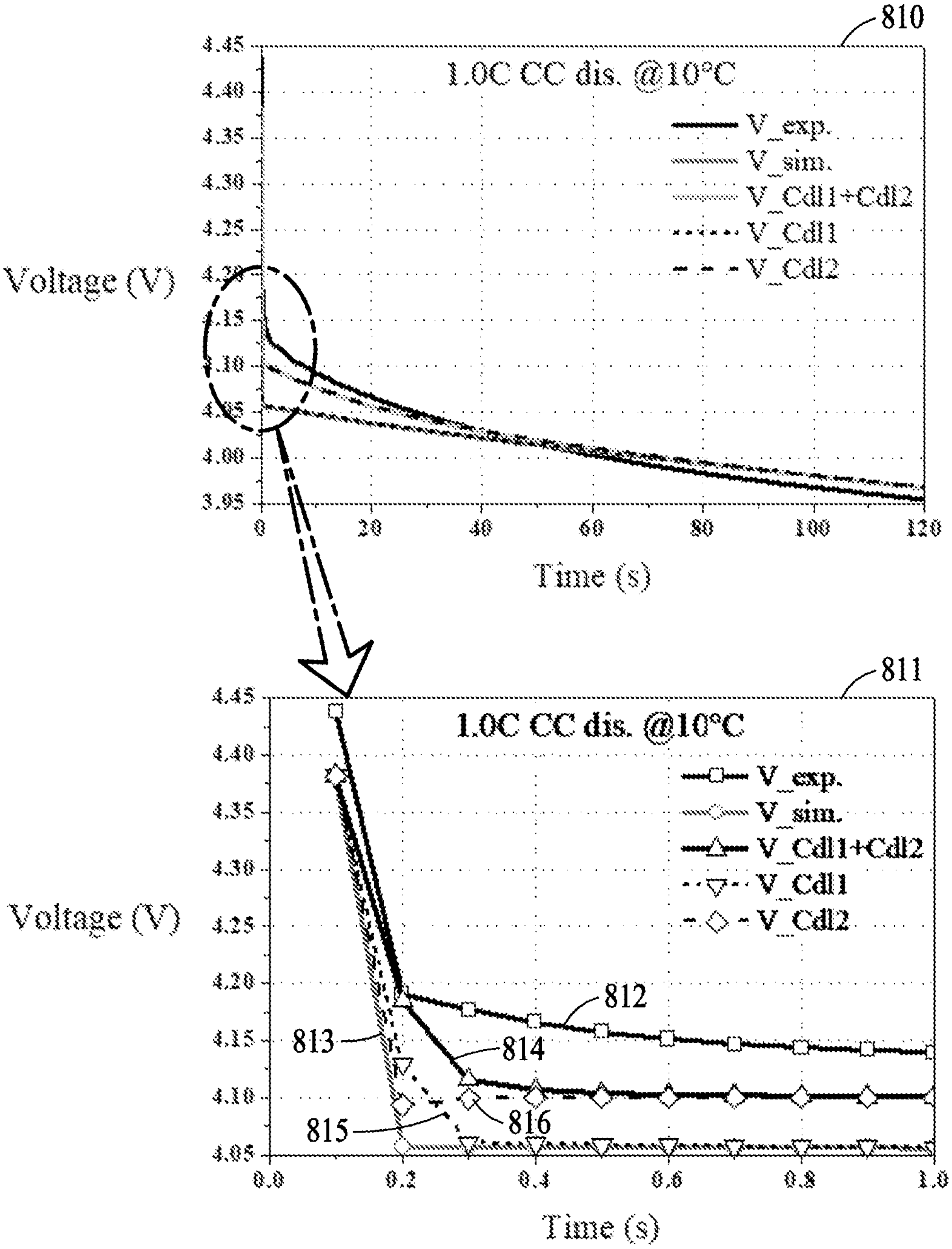
FIG. 8B illustrates an example of a voltage of a battery being measured and a voltage being estimated by a battery model, when a temperature of the battery is 10° C.

FIG. 8B illustrates an example of a voltage of a battery being measured and an estimated voltage being estimated by a battery model, when a temperature of the battery is 10° C.

A first graph 810 shows an actual voltage of a battery and an estimated voltage estimated by a battery model for 0 seconds to 120 seconds when the battery temperature is 10° C. and a current of 1 A is being discharged from the battery. A second graph 811 is a graph in which a part representing a period from 0 seconds to 1 second of the first graph 810 is enlarged.

A first curve 812 may represent an actual voltage of the battery. A second curve 813 may represent an estimated voltage of the battery obtained by applying an initial value of an applied current of the battery to a battery model. A third curve 814 may represent an estimated voltage of the battery obtained by applying a correction value of an applied current of a corrected battery to the battery model, based on a value of a first correction parameter and a value of a second correction parameter. A fourth curve 815 may represent an estimated voltage of the battery obtained by applying the correction value of the applied current of the corrected battery to the battery model, based on the value of the first correction parameter. A fifth curve 816 may represent an estimated voltage of the battery obtained by applying the correction value of the applied current of the corrected battery to the battery model, based on the value of the second correction parameter.

According to the first curve 812 of the second graph 811, the actual voltage of the battery drops rapidly in an initial period (e.g., a period from 0 seconds to 0.2 seconds) in which the applied current changes. For example, a dropped value of the estimated voltage of the battery obtained based on the initial value of the applied current may be greater than a dropped value of the actual voltage in the initial section. Since the estimated variation is greater than the actual variation of the voltage, the accuracy of the internal state of the battery determined based on the initial value of the applied current may decrease. For example, a dropped value of the estimated voltage of the battery obtained based on a correction value of the applied current may be similar to a dropped value of the actual voltage in the initial period. Since the actual variation and the estimated variation of the voltage are similar, the accuracy of the internal state of the battery determined based on the correction value of the applied current may increase.

Figure 8C:
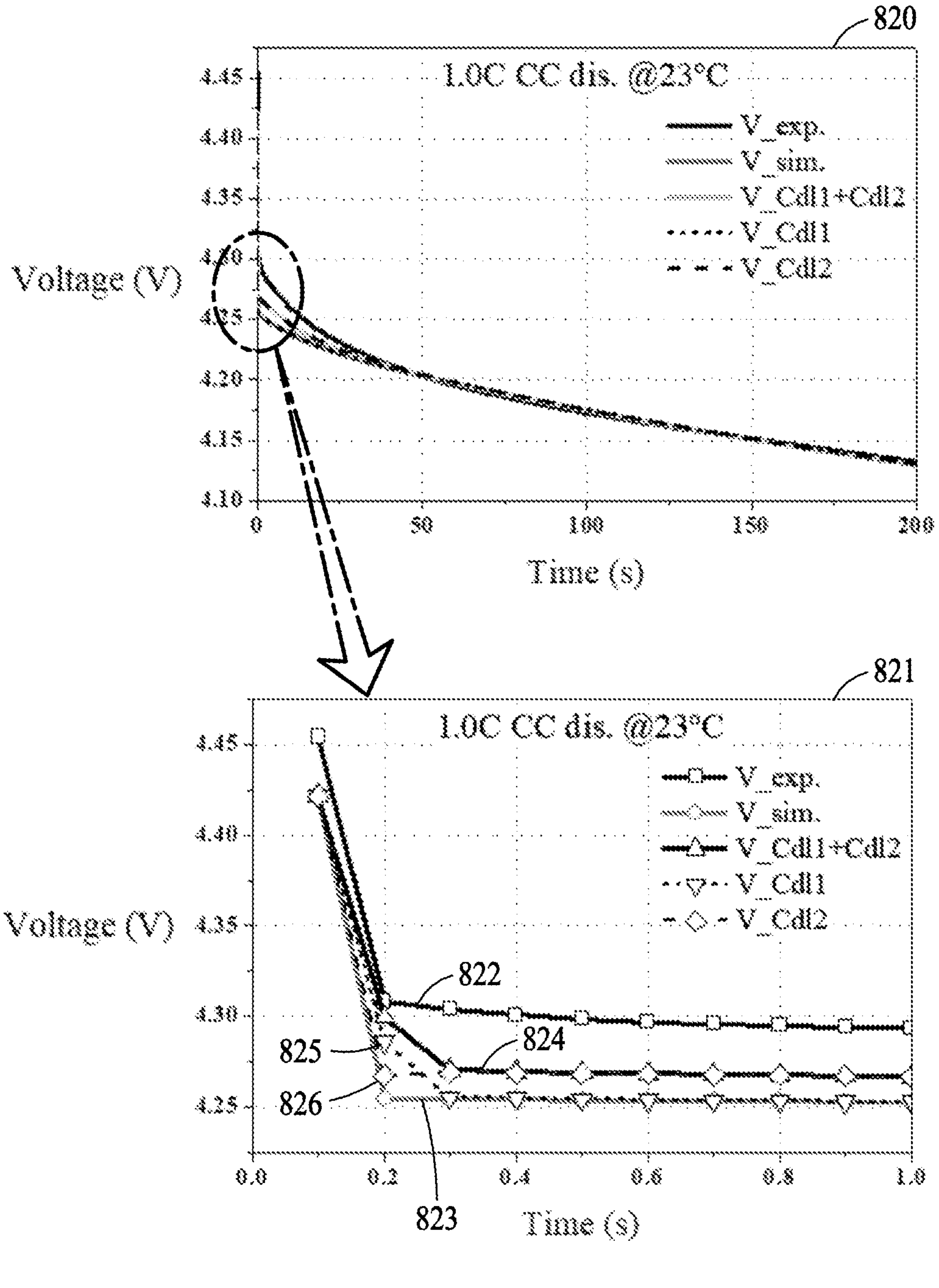
FIG. 8C illustrates an example of a voltage of a battery being measured and a voltage being estimated by a battery model, when a temperature of the battery is 23° C.

FIG. 8C illustrates an example of a voltage of a battery being measured and a voltage being estimated by a battery model, when a temperature of the battery is 23° C.

A first graph 820 shows an actual voltage of a battery and an estimated voltage estimated by a battery model for 0 seconds to 200 seconds when the battery temperature is 23° C. and a current of 1 A is discharged from the battery. A second graph 821 is a graph in which a part representing a period from 0 seconds to 1 second of the first graph 820 is enlarged.

A first curve 822 may represent an actual voltage of the battery. A second curve 823 may represent an estimated voltage of the battery obtained by applying an initial value of an applied current of the battery to a battery model. A third curve 824 may represent an estimated voltage of the battery obtained by applying a correction value of an applied current of a corrected battery to the battery model, based on a value of a first correction parameter and a value of a second correction parameter. A fourth curve 825 may represent an estimated voltage of the battery obtained by applying the correction value of the applied current of the corrected battery to the battery model, based on the value of the first correction parameter. A fifth curve 826 may represent an estimated voltage of the battery obtained by applying the correction value of the applied current of the corrected battery to the battery model, based on the value of the second correction parameter.

According to the first curve 822 of the second graph 821, the actual voltage of the battery drops rapidly in an initial period (e.g., a period from 0 seconds to 0.2 seconds) in which the applied current changes. For example, a dropped value of the estimated voltage of the battery obtained based on the initial value of the applied current may be greater than a dropped value of the actual voltage in the initial period. Since the estimated variation is greater than the actual variation of the voltage, the accuracy of the internal state of the battery determined based on the initial value of the applied current may decrease. For example, a dropped value of the estimated voltage of the battery obtained based on a correction value of the applied current may be similar to a dropped value of the actual voltage in the initial period. Since the actual variation and the estimated variation of the voltage are similar, the accuracy of the internal state of the battery determined based on the correction value of the applied current may increase.

Figure 9:
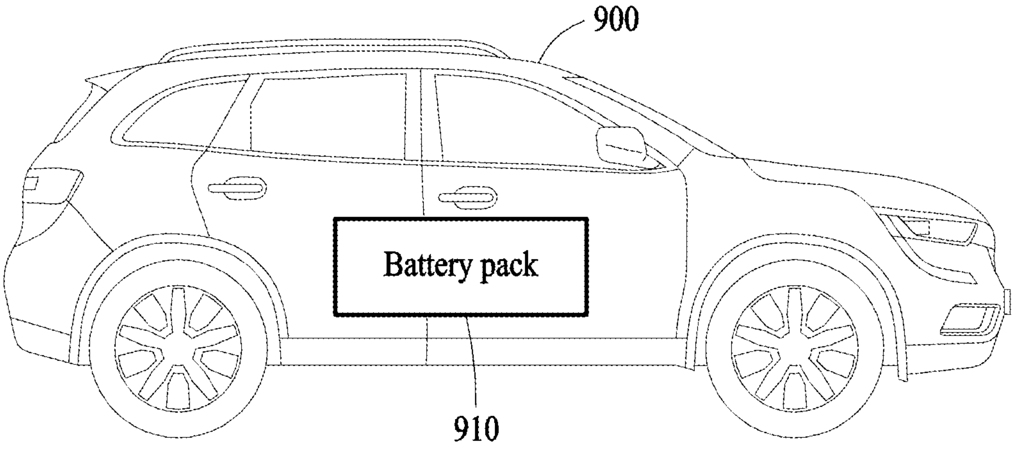
FIG. 9 illustrates an example of a vehicle.

FIG. 9 illustrates an example of a vehicle.

Referring to FIG. 9, a vehicle 900 includes a battery pack 910. The vehicle 900 may be a vehicle using the battery pack 910 as a power source. The vehicle 900 may be, for example, an electric vehicle or a hybrid vehicle.

The battery pack 910 includes a BMS and battery cells (or battery modules). The BMS may monitor the condition of the battery pack 910, and prevent over-charging or over-discharging of the battery pack 910. Further, the BMS may perform thermal control for the battery pack 910 when the temperature of the battery pack 910 exceeds a first temperature (for example, 40° C.) or is less than a second temperature (for example, −10° C.). In addition, the BMS may perform cell balancing so that the battery cells in the battery pack 910 have balanced charging states.

In an example, the BMS of the battery pack 910 may monitor whether a short circuit occurs inside the battery cells.

The description provided with reference to FIGS. 1 to 8 also applies to FIG. 9, and are incorporated herein by reference. Thus, a detailed description will be omitted for conciseness.

Figure 10:
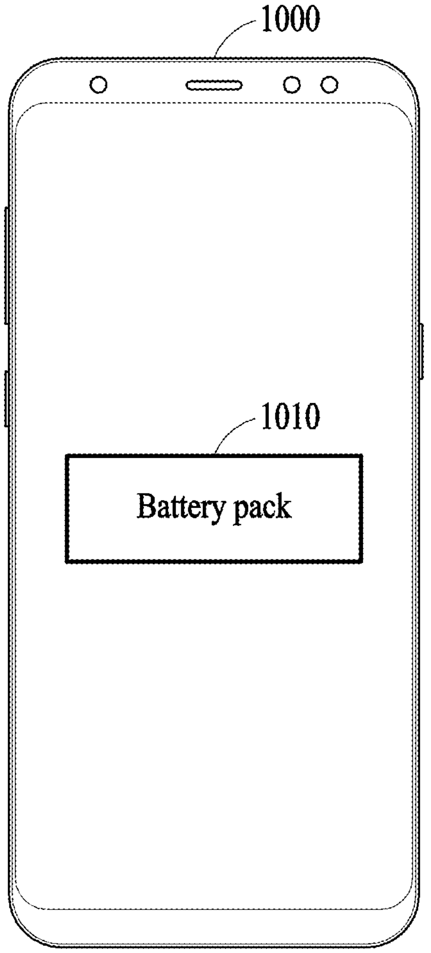
FIG. 10 illustrates an example of a mobile terminal.

FIG. 10 illustrates an example of a mobile terminal.

Referring to FIG. 10, a mobile terminal 1000 includes a battery pack 1010. The mobile terminal 1000 may be a device that uses the battery pack 1010 as a power source. The mobile terminal 1000 may be a portable terminal such as, for example, a smart phone. The battery pack 1010 may include a BMS and battery cells (or battery modules).

In an example, the BMS of the battery pack 1010 may monitor whether a short circuit occurs inside the battery cells, and prevent over-charging or over-discharging of the battery cells.

The description provided with reference to FIGS. 1 to 9 also applies to FIG. 10, and are incorporated herein by reference. Thus, a detailed description will be omitted for conciseness.

Figure 11:
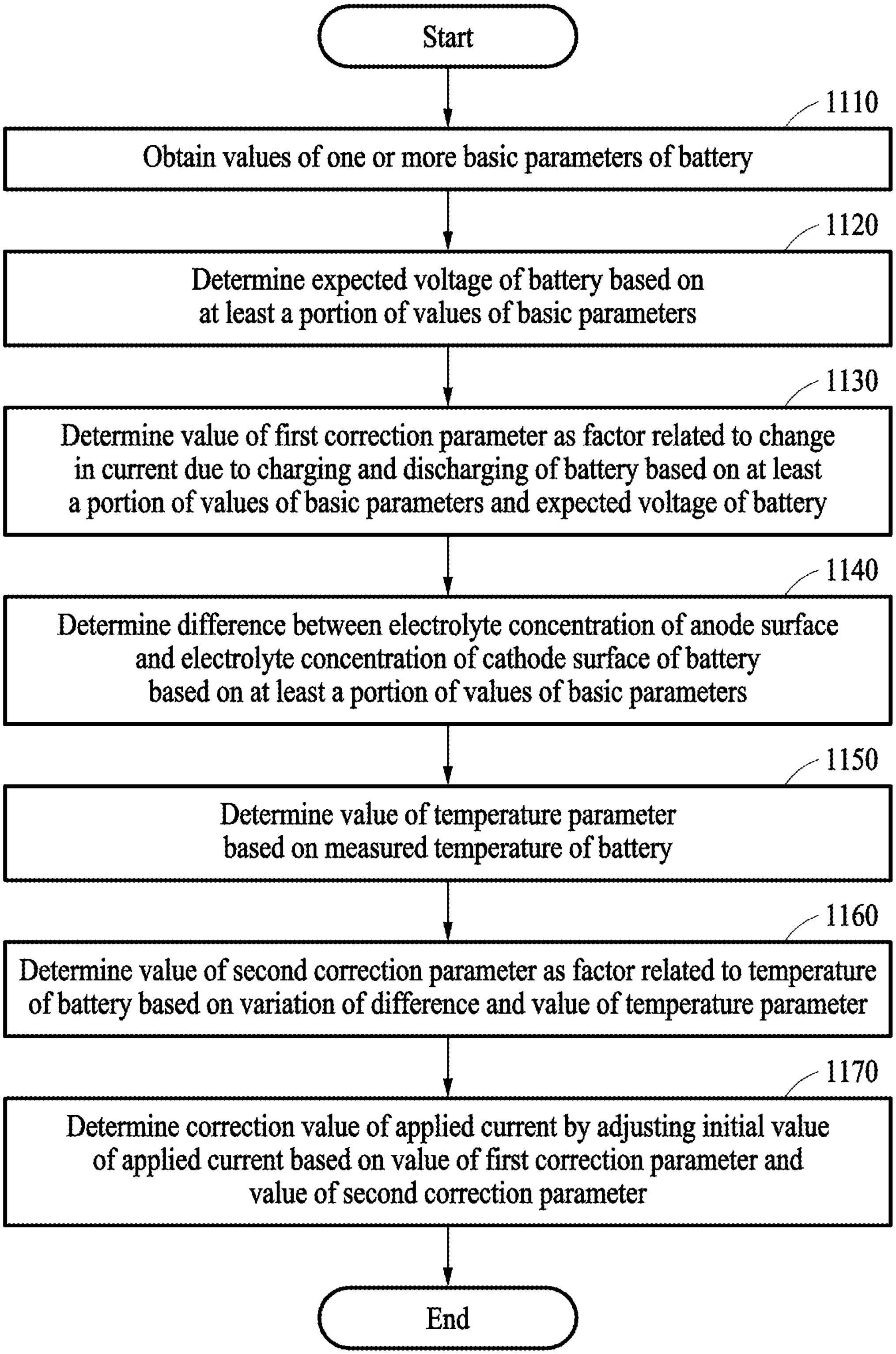
FIG. 11 illustrates an example of a method of adjusting a value of an applied current of a battery based on an expected voltage of the battery.

FIG. 11 illustrates an example of a method of adjusting a value of an applied current of a battery based on an expected voltage of the battery. The operations of FIG. 11 may be performed in the sequence and manner as shown. However, the order of some operations may be changed, or some of the operations may be omitted, without departing from the spirit and scope of the shown example. Additionally, operations illustrated in FIG. 11 may be performed in parallel or simultaneously. One or more blocks of FIG. 11, and combinations of the blocks, can be implemented by special purpose hardware-based computer that perform the specified functions, or combinations of special purpose hardware and instructions, e.g., computer or processor instructions. For example, operations 1110 through 1170 may be performed by the electronic device 400 described above with reference to FIG. 4. In addition to the description of FIG. 11 below, the descriptions of FIGS. 1-10 are also applicable to FIG. 11 and are incorporated herein by reference. Thus, the above description may not be repeated here for brevity purposes.

In operation 1110, the electronic device 400 may obtain values of one or more basic parameters of a battery connected to the electronic device 400. For example, the one or more basic parameters may include current that is applied to the battery and a measured temperature of the battery. For example, the one or more basic parameters may further include a measured voltage of the battery. The values of the basic parameters may be generated through one or more sensors.

The description of operation 1110 may be supplemented with the description of operation 510 described above with reference to FIG. 5, and thus any repeated discussion thereof will be omitted.

In operation 1120, the electronic device 400 may determine an expected voltage of the battery based on a portion of the values of the basic parameters.

In an example, a battery model may be used to determine the expected voltage of the battery. For example, to quickly determine the expected voltage of the battery, a light-weight battery model may be used to calculate only the expected voltage of the battery, rather than the entire internal state of the battery.

In operation 1130, the electronic device 400 may determine a value of a first correction parameter as a factor related to a change in current due to charging and discharging of the battery based on at least a portion of the values of the basic parameters and the expected voltage of the battery.

The description of operation 1130 may be supplemented with the description of operation 520 above referring to FIG. 5, and thus any repeated discussion thereof will be omitted. For example, a description of the measured voltage of the battery in operation 520 may be replaced with a description of the expected voltage of the battery.

In operation 1140, the electronic device 400 may determine a difference $C_E$ between an electrolyte concentration $C_{E,N}$ of an anode surface and an electrolyte concentration $C_{E,P}$ of a cathode surface of the battery based on at least a portion of the values of the basic parameters.

The description of operation 1140 may be supplemented with the description of operation 530 above referring to FIG. 5, and thus any repeated discussion thereof will be omitted.

In operation 1150, the electronic device 400 may determine a value of a temperature parameter based on a measured temperature of the battery.

The description of operation 1150 may be supplemented with the description of operation 540 above referring to FIG. 5, and thus any repeated discussion thereof will be omitted.

In operation 1160, the electronic device 400 may determine a value of a second correction parameter as a factor related to the temperature of the battery, based on a variation of a difference $C_E$ between an electrolyte concentration $C_{E,N}$ of an anode surface and an electrolyte concentration $C_{E,P}$ of a cathode surface of the battery and a value of the temperature parameter.

The description of operation 1160 may be supplemented with the description of operation 550 above referring to FIG. 5, and thus any repeated discussion thereof will be omitted.

In operation 1170, the electronic device 400 may determine a correction value of an applied current by adjusting an initial value of the applied current based on a value of a first correction parameter and a value of a second correction parameter.

The description of operation 1170 may be supplemented with the description of operation 560 above referring to FIG. 5, and thus any repeated discussion thereof will be omitted.

The BMS 120 and other computing apparatuses, the electronic devices, the processors, the memories, and other components described herein with respect to FIGS. 1-8 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 5-7, and 11 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-Res, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A method of adjusting a value of a current of a battery, performed by an electronic device, the method comprising:

obtaining values of one or more basic parameters of a battery comprising the current of the battery, a voltage of the battery, and a temperature of the battery;

determining a value of a first correction parameter relating to a variation in current due to charging and discharging of the battery, based on at least a portion of the value of the one or more basic parameters;

determining a difference between an electrolyte concentration of an anode surface and an electrolyte concentration of a cathode surface of the battery, based on at least a portion of the values of the one or more basic parameters;

determining a value of a temperature parameter based on the temperature of the battery;

determining a value of a second correction parameter relating to a temperature of the battery, based on a variation of the difference and the value of the temperature parameter;

determining a correction value of the current of the battery by adjusting an initial value of the current, based on the value of the first correction parameter and the value of the second correction parameter;

applying the correction value to a battery model for estimating an internal state of the battery; and controlling the charging or discharging of the battery using internal state conditions defined based on the internal state of the battery.

2. The method of claim 1, wherein the battery model is an electro-chemical model or an electro-circuit model.

3. The method of claim 1, wherein the first correction parameter and the second correction parameter relate to current accumulated in a double layer capacitor formed at an interface between an electrode and an electrolyte of the battery.

4. The method of claim 1, wherein the current of the battery comprises any one of:

a charging current input to the battery in response to the battery being charged; or a discharge current supplied by the battery in response to the battery being discharged.

5. The method of claim 1, wherein the determining of the value of the first correction parameter comprises:

determining the value of the first correction parameter based on a capacitance per electrode area of the battery, a total electrode area of the battery, and a change rate of a voltage of the battery.

6. The method of claim 1, wherein the determining of the difference between the electrolyte concentration of the anode surface and the electrolyte concentration of the cathode surface of the battery comprises:

determining a change in a concentration distribution of the electrolyte of the battery, based on at least a portion of the values of the one or more basic parameters; and determining the difference between the electrolyte concentration of the anode surface and the electrolyte concentration of the cathode surface of the battery, based on the change in the concentration distribution of the electrolyte of the battery.

7. The method of claim 1, wherein a first value of the temperature parameter determined with respect to a first temperature of the battery is greater than or equal to a second value of the temperature parameter determined with respect to a second temperature that is higher than the first temperature.

8. The method of claim 1, further comprising:

determining whether a variation in the current is greater than or equal to a threshold variation; and applying the values of the one or more basic parameters to the battery model for estimating the internal state of the battery, in response to the variation not being greater than or equal to the threshold variation.

9. The method of claim 8, wherein the value of the first correction parameter and the value of the second correction parameter are determined, in response to the variation being greater than or equal to the threshold variation.

10. The method of claim 1, wherein the battery is included in a mobile terminal.

11. The method of claim 1, wherein the battery is included in a vehicle.

12. The method of claim 1, the difference between the electrolyte concentration of the anode surface and the electrolyte concentration of the cathode surface is determined by applying any one or any combination of the current of the battery, the voltage of the battery, the temperature of the battery a diffusion coefficient of the electrolyte, and a prior concentration distribution of the electrolyte to a battery model.

13. An electronic device for adjusting a value of a current of a battery, the electronic device comprising:

a memory configured to store a program; and a processor configured to execute the program to configure the electronic device to obtain values of one or more basic parameters of a battery comprising the current of the battery, a voltage of the battery, and a temperature of the battery;

determine a value of a first correction parameter relating to a variation in current due to charging and discharging of the battery, based on at least a portion of the values of the one or more basic parameters;

determine a difference between an electrolyte concentration of an anode surface and an electrolyte concentration of a cathode surface of the battery, based on at least a portion of the values of the one or more basic parameters;

determine a value of a temperature parameter based on the temperature of the battery;

determine a value of a second correction parameter relating to a temperature of the battery, based on a variation of the difference and the value of the temperature parameter;

determine a correction value of the current by adjusting an initial value of the current, based on the value of the first correction parameter and the value of the second correction parameter;

apply the correction value to a battery model for estimating an internal state of the battery; and control the charging or discharging of the battery using internal state conditions defined based on the internal state of the battery.

14. A processor-implemented method of adjusting a value of a current of a battery, the method comprising:

obtaining values of one or more basic parameters of a battery comprising the current of the battery and a temperature of the battery;

determining a value of a voltage of the battery based on at least a portion of the one or more basic parameters;

determining a value of a first correction parameter relating to a change in current due to charging and discharging of the battery, based on at least a portion of the values of the one or more basic parameters and the value of the voltage of the battery;

determining a difference between an electrolyte concentration of an anode surface and an electrolyte concentration of a cathode surface of the battery, based on at least a portion of the values of the one or more basic parameters;

determining a value of a temperature parameter based on the temperature of the battery;

determining a value of a second correction parameter relating to a temperature of the battery, based on a variation of the difference and the value of the temperature parameter;

determining a correction value of the current by adjusting an initial value of the current, based on the value of the first correction parameter and the value of the second correction parameter applying the correction value to a battery model for estimating an internal state of the battery; and controlling the charging or discharging of the battery using internal state conditions defined based on the internal state of the battery.

15. The method of claim 14, further comprising:

applying the correction value to a battery model for estimating an internal state of the battery.

16. The method of claim 14, wherein the first correction parameter and the second correction parameter relate to current accumulated in a double layer capacitor formed at an interface between an electrode and an electrolyte of the battery.

17. The method of claim 14, wherein the current of the battery comprises any one of:

a charging current input to the battery in response to the battery being charged; or a discharge current supplied by the battery in response to the battery being discharged.

18. The method of claim 14, wherein the determining of the value of the first correction parameter comprises:

determining the value of the first correction parameter based on a capacitance per electrode area of the battery, a total electrode area of the battery, and a change rate of a voltage of the battery.

19. The method of claim 14, further comprising:

determining whether a variation in the current is greater than or equal to a threshold variation; and applying the values of the one or more basic parameters to the battery model for estimating the internal state of the battery, in response to the variation not being greater than or equal to the threshold variation.

* * * * *